US011476821B2

(12) United States Patent
Reid

(10) Patent No.: US 11,476,821 B2
(45) Date of Patent: Oct. 18, 2022

(54) ELECTRONIC FILTER APPARATUS

(71) Applicant: Reid Acoustic Designs Ltd., London (GB)

(72) Inventor: Laurence Reid, London (GB)

(73) Assignee: REID ACOUSTIC DESIGNS LTD., London (GB)

( * ) Notice: Subject to any disclaimer, the term of this patent is extended or adjusted under 35 U.S.C. 154(b) by 63 days.

(21) Appl. No.: 16/978,979

(22) PCT Filed: Mar. 6, 2019

(86) PCT No.: PCT/GB2019/050633
§ 371 (c)(1),
(2) Date: Sep. 8, 2020

(87) PCT Pub. No.: WO2019/171059
PCT Pub. Date: Sep. 12, 2019

(65) Prior Publication Data
US 2020/0412320 A1 Dec. 31, 2020

(30) Foreign Application Priority Data
Mar. 6, 2018 (GB) ..................................... 1803569

(51) Int. Cl.
*H03H 7/06* (2006.01)
*H03F 3/217* (2006.01)
*H04R 3/04* (2006.01)

(52) U.S. Cl.
CPC .............. *H03H 7/06* (2013.01); *H03F 3/217* (2013.01); *H04R 3/04* (2013.01); *H03F 2200/03* (2013.01);
(Continued)

(58) Field of Classification Search
CPC ....... H03H 7/06; H03F 3/217; H03F 2200/03; H03F 2200/165; H03F 2200/451; H04R 3/04
(Continued)

(56) References Cited

U.S. PATENT DOCUMENTS

2017/0155381 A1* 6/2017 Raimondi et al. ... H03K 5/1252
2017/0207795 A1 7/2017 Ghosh et al.

FOREIGN PATENT DOCUMENTS

CN 105554634 A * 5/2015 ............... H04R 3/00
EP 0655830 A1 5/1995
(Continued)

OTHER PUBLICATIONS

United Kingdom Combined Search and Examination Report issued in United Kingdom Application No. GB1803569.1, dated Jul. 23, 2018, 7 pages.

*Primary Examiner* — Hafizur Rahman
(74) *Attorney, Agent, or Firm* — Wilmer Cutler Pickering Hale and Dorr LLP

(57) ABSTRACT

An electronic apparatus is described. The apparatus includes a circuit element configured to output a signal comprising a modulated frequency component. The apparatus also includes a filter arrangement comprising first, second and third notch filter arrangements, wherein each of the first and second notch filter arrangements comprise a first series inductor, and a series shunt configuration comprising a second inductor and a capacitor coupled in series and the third notch filter arrangement comprises a series inductor and a shunt capacitor, wherein each of the notch filter arrangements are configured to generate a notch in a frequency response to attenuate the output signal at a frequency of the modulated frequency component.

16 Claims, 6 Drawing Sheets

(52) U.S. Cl.
CPC .. *H03F 2200/165* (2013.01); *H03F 2200/451* (2013.01)

(58) Field of Classification Search
USPC ........................................................ 330/251
See application file for complete search history.

(56) References Cited

FOREIGN PATENT DOCUMENTS

| | | | |
|---|---|---|---|
| GB | 1560195 | A | 1/1980 |
| IT | 1178036 | B * | 9/1987 |
| WO | WO-85/01844 | A1 | 4/1985 |

* cited by examiner

ELECTRONIC FILTER APPARATUS

CROSS-REFERENCE TO RELATED APPLICATIONS

This application is a 371 national phase of PCT/GB2019/050633, filed Mar. 6, 2019, which claims the benefit and priority of United Kingdom Patent Application No. 1803569.1, filed Mar. 6, 2018, each of which is hereby incorporated by reference in its entirety as if fully set forth herein.

The invention relates to an electronic filter apparatus. In particular, the invention relates to an electronic apparatus comprising a circuit element, such as a switching amplifier, configured to output a signal comprising a modulated frequency component and cascaded notch filter arrangements. The signal has phase information that is sensitive to alteration, such as audio.

BACKGROUND

FIG. 1 illustrates an example of an audio pulse width modulation (PWM) amplifier 2. An audio PWM amplifier is a switching amplifier with a switching frequency usually in the region of 20 to 40 times higher than the highest audio frequency of the audio signal. The amplifier includes a power stage 4. The power stage 4 includes a gate driver or switching controller 6 which generates a signal comprising square pulses of fixed amplitude with a varying width and separation. It will be appreciated that the gate driver 6 generates a signal and an inverted and time delayed version of the same, the protective time delay is commonly known as dead-time. The amplifier comprises block 14, which includes an integrator, comparator and switching frequency clock generator, with the clock typically in the form of a triangular or saw-tooth waveform. The low-frequency portion of the signal generated by block 14 is the audio signal to be amplified and the high-frequency portion from the clock source which serves to create a PWM digital signal (i.e. a signal which switches between two distinct, pre-defined voltages) when combined with the low frequency audio signal.

The power stage 4 includes two switching devices 8, 10. The output of the gate driver 6 is coupled to the two switching devices in a push-pull or totem-pole arrangement. In the circuit illustrated in FIG. 1, the switches are field effect transistors (FET) 8, 10. In the figure, the upper FET 8 is driven by the signal output by the driver 6 and the lower FET 10 is driven by the inverted and time delayed version of the same. The two switches 8, 10 are arranged so as to be either fully on or fully off such that the output of the switching devices is at either +Vcc or −Vcc (i.e. the bus voltages). This type of arrangement utilises the property that if the push-pull output devices are either fully on or fully off they dissipate their minimum power leading to high amplifier efficiency. The output of the power stage 4 is fed back to summation 12, whereby the input audio signal is summed with the output of the power stage 4. The summed signal is fed to block 14 to assist in compensating for variations in the output voltage with respect to the input voltage, due to finite and varying load configurations, and variations in bus voltage.

The output of the power stage 4 is filtered using a passive low pass filter 16 to filter out the switching frequency to allow a loudspeaker load 18 of the amplifier 2 to only see the audio signal. The standard and commonly used filter for the passive filter 16 is a two-pole inductor-capacitor (LC) filter. The commonly used component values for the passive filter 16 are a series inductor 20 of 20 µH and a capacitor 22 of 470 nF shunted to ground. The loudspeaker 18 may naturally filter out residual switching frequency energy conducted from the amplifier output with the audio signal. This residual energy may cause extra heat in the loudspeaker drive units, which may result in reduced linearity of the loudspeaker operation. This is undesirable.

The passive filter 16 provides an approximate voltage rejection of 35 dB (1/56) at the switching frequency of the power amplifier output and may also be detrimental to the audio signal integrity causes 20 degrees of phase shift at 20 kHz with an 8 ohm load, 36 degrees of phase shift at 20 kHz with a 4 ohm load and 55 degrees of phase shift at 20 kHz into a 2 ohm load. Loudspeaker impedance with respect to frequency curves are not flat and the impedance may vary from 16 ohms at loudspeaker resonance/crossover to 3 ohms at DC due to the resistance of the voice coil. These standard component values cause audio material dependent vs loudspeaker dependent phase shifts in the audio which is noticeable to the discerning listener. Thus the quality of the audio and the listening experience is degraded.

Reducing the series inductor 20 to 5 µH may reduce the phase shifts mentioned above by a factor of 4 with an 8 ohm load. The reduction brings the loudspeaker phase-shift in line with the expectations of an analogue amplifier of around 5 degrees at 20 kHz with an 8 ohm load. The sound quality from the amplifier is also brought in line with the expectations of an analogue amplifier. It is noted that the series inductor should not be typically reduced below 5 µH as this component limits/controls the peak current seen by the switching devices 8, 10. However, reducing the series inductor also reduces the roll off achieved at the switching frequency of the amplifier, such that additional filtering is required to achieve a suitable level of attenuation of the switching frequency.

In this regard, it is widely accepted within the field of audio that high definition audio of 16 bits or higher demands a noise floor that is more than 90 dB below the full-scale signal, to be below the perception of the discerning listener. Therefore, it would be desirable to provide a circuit which meets the expectations of phase-shift and sound quality of an analogue amplifier using a PWM amplifier, for example, while achieving a suitable level of attenuation of the switching frequency.

BRIEF DESCRIPTION OF THE DRAWINGS

The present disclosure can be understood with reference to the description of the embodiments set out below, in conjunction with the appended drawings in which.

DESCRIPTION

According to a first embodiment of the invention there is provided an electronic apparatus comprising a circuit element configured to output a signal comprising a modulated frequency component; and a filter arrangement comprising first, second and third notch filter arrangements (i.e. three cascaded filter arrangements), wherein each of the first and second notch filter arrangements comprise a first series inductor, and a series shunt configuration comprising a second inductor and a capacitor coupled in series and the third notch filter arrangement comprises a series inductor and a shunt capacitor, wherein each of the notch filter arrangements are configured to generate a notch in a frequency response to attenuate the output signal at a frequency of the modulated frequency component.

The first series inductor of each of the second and third notch filter arrangements may be a common mode choke.

The first series inductor of the second notch filter arrangement may be coupled to the first series inductor of the first notch filter arrangement and the series inductor of the third notch filter arrangement may be coupled to the capacitor of the first notch filter arrangement.

The apparatus may comprise a fourth notch filter arrangement comprising an inductor and a capacitor coupled in series, wherein the inductor and the capacitor of the fourth notch filter arrangement is coupled to the first series inductor of the second notch filter arrangement.

The apparatus may comprise a voltage follower arranged at the output of the filter arrangement. The apparatus may also comprise an operational amplifier gain stage.

The output signal may be a pulse width modulated signal, and may be an audio signal or a motor control signal.

The modulated frequency component may be a triangular waveform.

The circuit element may be a switching amplifier, and the switching amplifier may be a pulse width modulation amplifier.

The circuit element may be a modulated carrier signal receiver, and the modulated frequency component is a carrier signal.

Audio is a field that specializes in high integrity signal processing and reconstruction, due to the non-linear and high dynamic range and response of the human ear and its ability to detect phase shift and timing differences in sounds and music, especially when an audio signal passes through a filter or a circuit that has an altering effect on the signal phase information. Therefore, the apparatus described herein may be used for any application that requires high integrity signal reconstruction or recovery from a modulated signal that is sensitive to phase preservation. The phrase modulated frequency component is used herein to describe a signal component which has been modulated when being combined with an information signal (e.g. an audio signal) in an amplifier (e.g. in an audio pulse width modulation (PWM) amplifier), or a carrier wave/component which has been modulated by an information signal for transmission.

Figure 2:
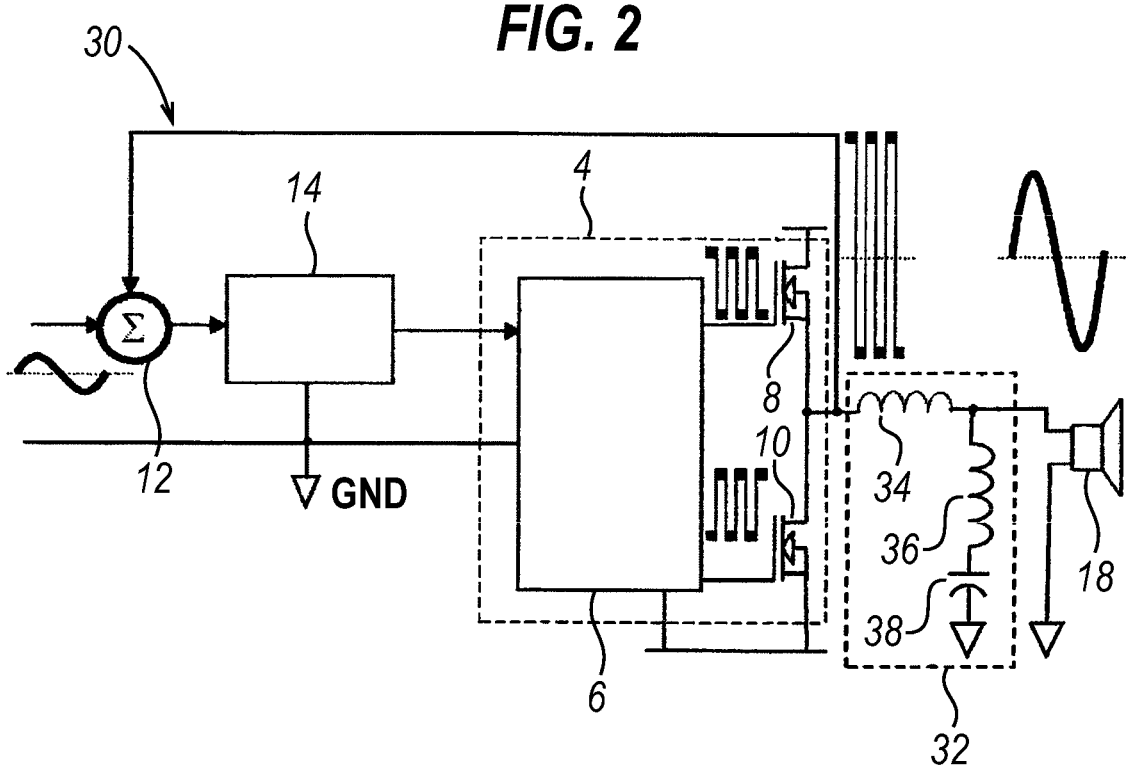
FIG. 2 illustrates an audio circuit.

FIG. 2 illustrates an audio circuit 30. The audio circuit 30 is an audio pulse width modulation (PWM) amplifier.

A PWM amplifier is a switching amplifier with a switching frequency typically in the region of 20 to 40 times higher than the highest audio frequency of an input audio signal. The audio circuit 30 includes a power stage 4. The power stage 4 includes a gate driver or switching controller 6 which generates a signal comprising square pulses of fixed amplitude with a varying width and separation. It will be appreciated that the gate driver generates a signal and an inverted and time delayed version of the same, to provide output device switching protection commonly referred to as deadtime. The low-frequency component of the signal generated by block 14 is the audio signal to be amplified and the high-frequency component of the signal is typically a triangular or saw-tooth waveform which serves to create a digital signal (i.e. a signal which switches between two distinct, predefined voltages) when combined with the low frequency audio signal. The high frequency component is an out-of-band signal, or a signal to be modulated by the audio signal. As is known in the art, the low frequency, audio signal and the high frequency, switching signal (i.e. out-of-band signal) are combined using a comparator circuit.

The power stage 4 includes two switching devices 8, 10. The output of the gate driver 6 is coupled to the two switching devices in a push-pull or totem-pole arrangement. In the circuit illustrated in FIG. 2, the switches are field effect transistors (FET) 8, 10. In the figure, the upper FET 8 is driven by the signal output by the driver 6 and the lower FET 10 is driven by the inverted and time delayed version of the same. The two switches 8, 10 are arranged so as to be either fully on or fully off such that the output of the switching devices is at either +Vcc or −Vcc (i.e. the bus voltages). This type of arrangement utilises the property that if the push-pull output devices are either fully on or fully off they dissipate their minimum power leading to high amplifier efficiency. The output of the power stage 4 is fed back to summation 12, whereby the input audio signal is summed with the output of the power stage 4. The summed signal is fed to block 14 to assist in compensating for variations in the output voltage with respect to the input voltage, due to finite and varying load configurations, and variations in bus voltage. Block 14 includes an error amplifier or integrator, the output of which is coupled to a comparator which combines the audio signal output with a triangular or saw-tooth waveform generated by a signal generator, and the output of the comparator is fed to the power stage 4.

The output of the power stage 4 is filtered using a passive filter 32 to filter out the switching frequency to allow a loudspeaker load 18 of the audio circuit 30 to only see the audio signal.

Figure 1:
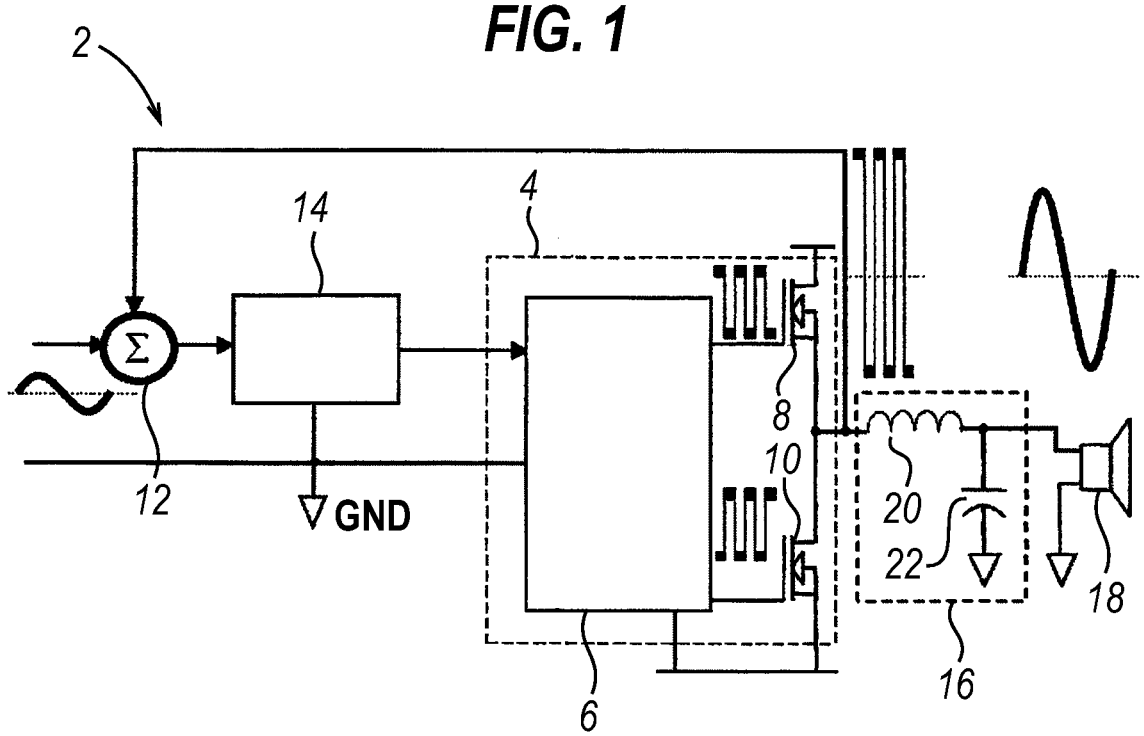
FIG. 1, described above, illustrates an example of an audio pulse width modulation (PWM) amplifier.

The passive filter 32 comprises a series inductor 34 (5 µH), and a (series) shunt arrangement comprising a capacitor 38 (470 nF) and an inductor 36 (337 nH) shunted to ground. That is to say that the capacitor 38 and the inductor 36 are coupled in series and arranged at the signal output of the power stage 4, along with the series inductor 34. A loudspeaker 18 is coupled to the series inductor 34 and ground with the shunt arrangement coupled in parallel with the loudspeaker 18. In comparison with the passive filter 16 of FIG. 1, an inductor is added in series with the shunt capacitor and the resonance of these two components is exploited to create a notch in the filter response. Due to the large factor between the upper frequency of the passband and the design selected notch frequency this is achieved without adding additional phase shift to the audio signal.

The passive filter arrangement 32 can include the same component values as may be commonly used. However, it will be appreciated that these may be changed based on the desired response. For example, a series inductor (i.e. series inductor 34) of up to 20 µH may be used. Effectively, the components of a low pass filter are used in the filter arrangement, and the low pass filter is configured to attenuate the signal, in this example, at a frequency that is greater than the highest typical audio frequency (i.e. 20 kHz) and less than the switching frequency (i.e. 400 kHz in this example). As described above with the series inductor 34 (5 µH), in addition to the cut-off frequency of the filter arrangement 32, the filter arrangement is configured to have a low phase shift of the order of 5 degrees, and in this example, around 5 degrees at 20 kHz with an 8 ohm load is achieved.

The shunt capacitor 38 and the shunt inductor 36 are selected to have high Q factor (i.e. a low internal resistance), and to satisfy the expression $F=\frac{1}{2}\pi\sqrt{(L*C)}$. In this expression, L is the inductance of the shunt inductor 36, C is the capacitance of the shunt capacitor 38, and F is equal to the switching frequency of the amplifier. It is appreciated that the switching frequency is equal to the frequency of the saw-tooth signal, for example, and may also be referred to as the modulated frequency component of the signal output by the power stage 4. In the passive filter 32 of FIG. 2, using L=336.8 nH (i.e. $L=1/((2\pi\times F)^2\times C))$ a further 33.6 dB rejection is achieved, totaling 61.9 dB at the switching frequency of 400 kHz. These values have been calculated using a loudspeaker with an 8 ohm load.

Figure 3:
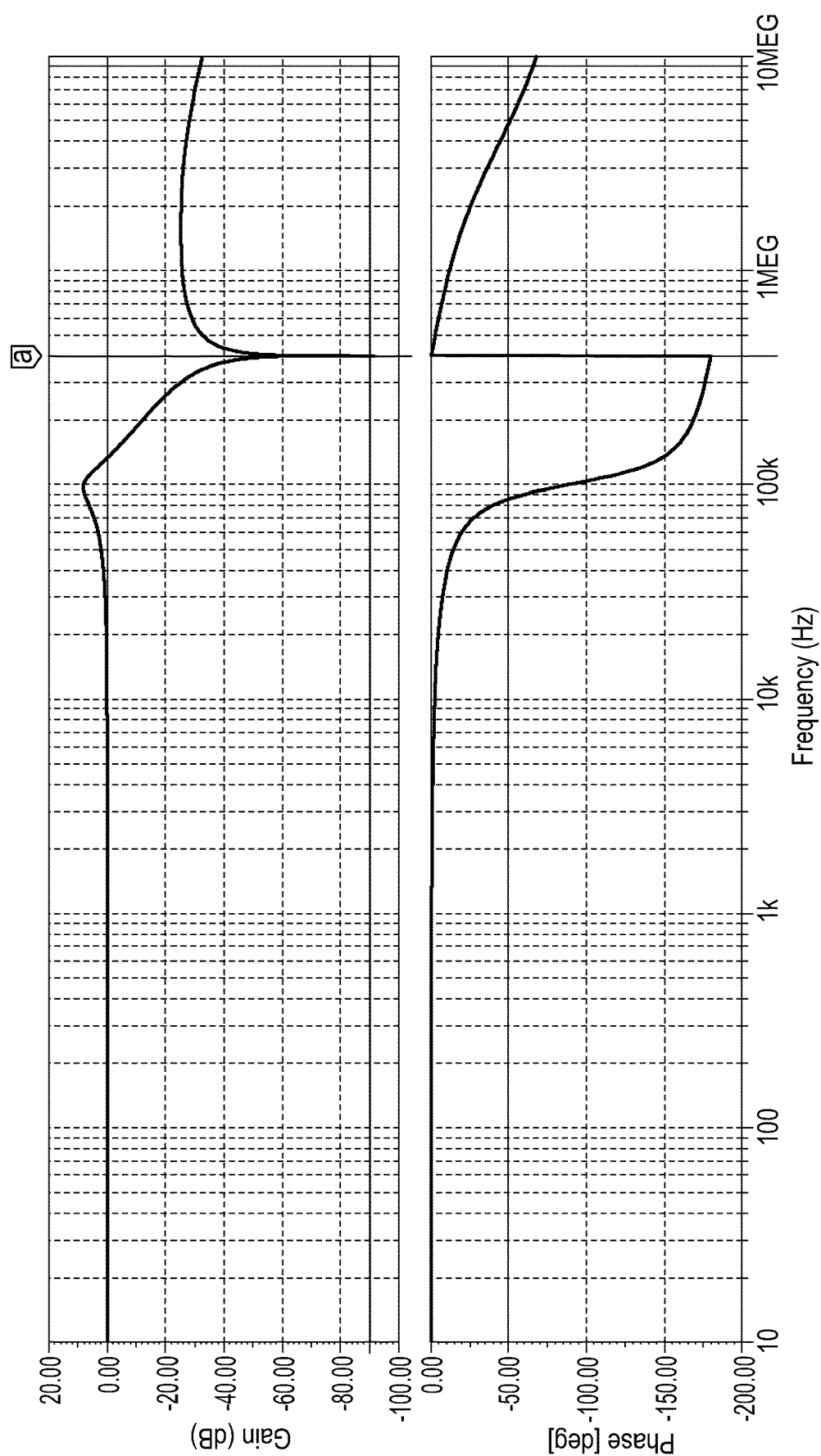
FIG. 3 illustrates a frequency response of a passive filter illustrated in FIG. 2.

FIG. 3 illustrates the frequency response of the passive filter arrangement 32 illustrated in FIG. 2. The upper graph illustrates gain in dB and the lower graph illustrates phase shift in degrees. As can be seen from FIG. 3, there is a notch in the frequency response at 400 kHz (i.e. 20 times the upper frequency of the audio signal of 20 kHz), which is the switching frequency (i.e. the frequency of the modulated component) of the power stage 4. Furthermore, the phase shift at 20 kHz (i.e. the upper frequency of the audio signal) is unchanged at 5 degrees when compared with the known passive filter 16 of FIG. 1.

It is noted that the passive filter is not derived from k of the filter (i.e. the characteristic impedance), and that the passband/termination impedance, the slope of the roll-off or stopband attenuation are not of interest by the addition of this extra pole (i.e. the notch). The only design requirement is that the notch be in-line with the switching frequency of the power stage or the PWM modulated signal (i.e. a modulated frequency component or a carrier wave component). The modulated frequency component may also be referred to as a modulation frequency component.

Figure 4:
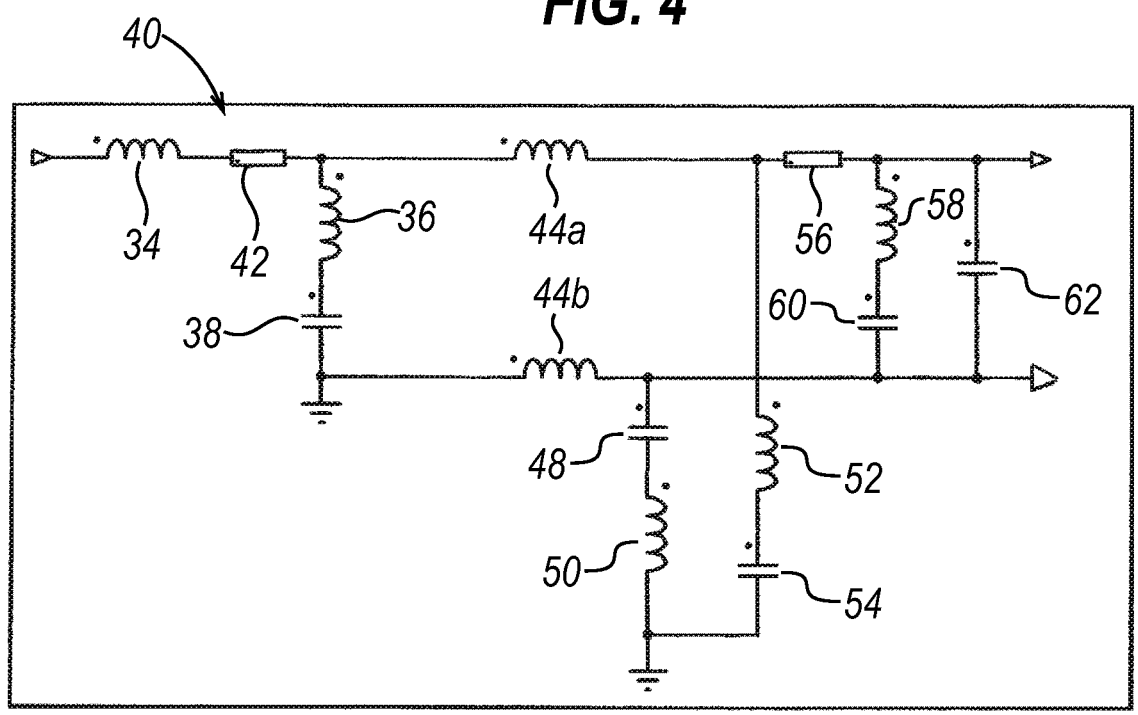
FIG. 4 illustrates a passive filter.

FIG. 4 illustrates a passive filter 40. The passive filter 40 can be used as a replacement of the passive filter 32 illustrated in FIG. 2. The series inductor 34, the shunt capacitor 38 and the shunt inductor 36 of the passive filter 40 are the same as those illustrated in FIG. 2. The passive filter 40 includes three further filter configurations. In the first additional filter configuration an additional series inductor 44a, and a series shunt arrangement comprising an inductor 52 and a capacitor 54 are provided. The first additional filter configuration is coupled to the series inductor 34 via a resistor 42, which is added to dampen the reactive components. Resistor 42 may be omitted for high power outputs to avoid power loss. In the second additional filter configuration an additional series inductor 44b, and a shunt arrangement comprising a capacitor 48 and inductor 50 are provided. Notably, the resonance effect created by capacitor 48 and inductor 50 includes inductor 50 summed with inductor 44b, so with design optimisation of the capacitor 48 value inductor 50 may be omitted whilst still achieving the desired notch frequency Series inductors 44a and 44b form a common mode choke (i.e. inductors 44a and 44b are provided by a common mode choke in which the common mode currents in the inductors 44a and 44b flow in the same direction through each of the choke/inductor windings). The second additional filter configuration is coupled to the ground connection of the capacitor 38. In the third additional filter configuration an additional series shunt arrangement comprising an inductor 58 and a capacitor 60 are added. The third additional filter configuration is added on the loudspeaker side of the filter, and is coupled to the inductor 44a of the first additional filter configuration and the inductor 44b of the second additional filter configuration. The third additional filter configuration is coupled to the inductor 44a of the first additional filter configuration via a resistor 56, which is added to dampen the reactive components. Resistor 56 may be omitted for high power outputs to avoid power loss. A capacitor 62 is also added across the loudspeaker load to control EMC at VHF.

By adding further inductors between the first filter stage (i.e. the series inductor 34, the shunt capacitor 38 and the shunt inductor 36) and the loudspeaker (i.e. inductors 44a and 52) and also the ground return (i.e. inductor 44b), and capacitors on the loudspeaker side of the inductors (i.e. capacitors 48, 54, 60 and 62), further stages of filtering, for example 3, can be cascaded which causes little further audio signal phase shift at 20 kHz but adds a further 3 sets of independently tuned resonances that can be used on an application specific basis to notch out harmonics of the switching frequency fundamental.

The capacitance values for shunt capacitors 54 and 60 should be selected to have negligible loading of the audio signal at 20 kHz based on $Xc=1/(2\pi\times F\times C)$. Also, with a normal amplifier operational load impedance of 8 ohms, the impedance of each capacitor at 20 kHz should be a multiple of the load impedance, in order to make this capacitor current a fraction of the load current. If each capacitor current is ⅓ of the load current at 20 kHz then the impedance will be ~32 ohms and the maximum limit of capacitance will be ~220 nF (capacitors 54 and 60) based on $Xc=1/(2\pi\times F\times C)$.

The common mode choke 44a and 44b is selected so that the phase shift at 20 kHz is within desired limits for the operational load impedance. For a 1 µH series inductor (i.e. inductors 44a and 44b) the phase shift is limited to 7.2 degrees at 20 kHz into the 8 ohm operational load.

The shunt network inductors 52 and 58 are determined based on the expression $L=1/((2\pi\times F)^2\times C)$, where F is chosen as the switching frequency and C is the selected capacitance for the shunt leg, here as 220 nF. Thus, shunt inductors 52 and 58 for a switching frequency of 400 kHz are selected to be 720 nH.

If inductor 50 is omitted then shunt capacitor 48 creates a resonant tank with series inductor 44b and shunt capacitor 48 value is calculated $C=1/((2\pi\times F)^2\times L)$, where F is chosen as the switching frequency and L is the inductance of series inductor 44b. Using these values and a switching frequency of 400 kHz shunt capacitor 48 would be theoretically 158.3 nF.

If inductor 50 is included and an arbitrary value of 100 nH is used, the calculated capacitance $C=1/((2\pi\times F)^2\times L)$, where L=inductance 44b+inductance 50. Inductor 50 may be added to the circuit to provide greater control or selectivity over the frequency being notched, vs the capacitance value for capacitor 48.

As detailed above a single LC notch filter can provide an additional 40 dB attenuation to a passive LC low pass filter configuration at a design selected frequency such as 400 kHz. If a further three LC filters of identical values are added in parallel, the first addition gives a further 6 dB attenuation, the second gives a further 4 dB attenuation, the third gives a further 2 dB attenuation, totaling 74 dB. The passive filter described in association with FIG. 4 allows up to a total of four LC notch filters (i.e. three could be used) to be used in a passive high-power filter network and achieve a theoretical 220 dB attenuation with minimal in-band signal phase shift. The ability to preserve phase is by use of a common mode choke, and its inherent property to preserve signal integrity by the action of the forward signal path field and the return signal path field to cancel, which minimises the inductance presented to a forward path current that exactly matches the return path current, such as the signal. When a further three LC notch filters are added to the load side of the common mode choke series inductances, and the resonances are selected to combine with differing and particular portions of the common mode choke inductances, with the across line and ground (commonly referred with use of common mode choke applications as X and Y) capacitances, the exceptionally high level of passive filter attenuation can be achieved by the selectively combined interaction of the phase lag (inductive) and phase lead (capacitive) reactances.

Figure 5:
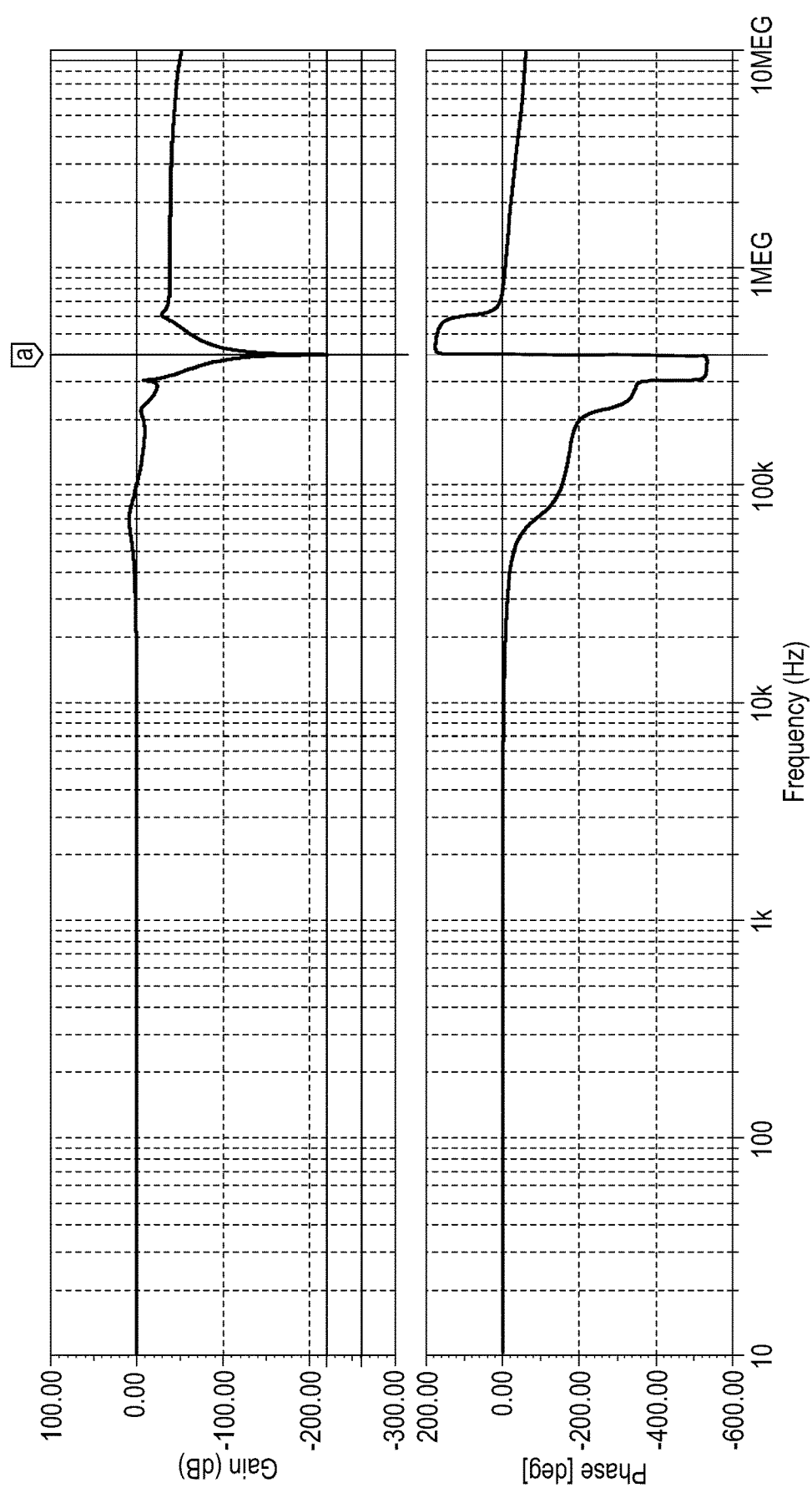
FIG. 5 illustrates a frequency response of the passive filter illustrated in FIG. 4.

FIG. 5 illustrates the frequency response of the passive filter arrangement 40 illustrated in FIG. 4. The upper graph illustrates gain in dB and the lower graph illustrates phase in degrees. As can be seen from FIG. 5, there is a notch in the frequency response at 400 kHz (i.e. 20 times the upper frequency of the audio signal of 20 kHz), which is the switching frequency of the power stage and gives a total 220.0 dB theoretical rejection at the switching frequency. Furthermore, the phase shift at 20 kHz (i.e. the upper frequency of the audio signal) is 7.6 degrees with an 8 ohm load.

Figure 6:
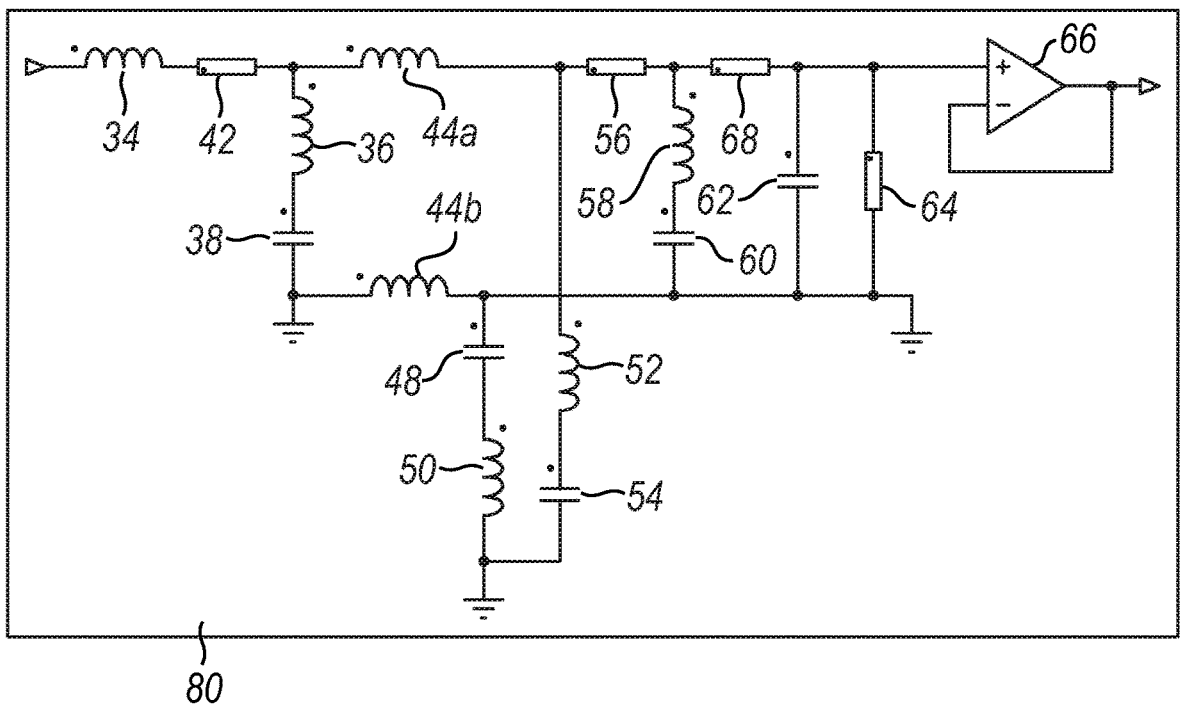
FIG. 6 illustrates an active filter arrangement.

FIG. 6 illustrates an active filter arrangement 80. The active filter arrangement 80 could be used for low power and line level filtering. The active filter arrangement 80 includes all the same component's illustrated in FIG. 4 with the addition of a voltage follower 66 (i.e. an operational amplifier with its output coupled to its inverting input). A shunt resistor 64 is provided having a value of 10 k ohms, for example, to place less loading on the filter components. An additional series resistor 68 is also provided having a value of 1 to 10 ohms if required. The shunt resistor 64 reduces the required power rating of the filter components but also reduces the damping of the filter. Accordingly additional series resistors can be added to control the circuit to have the same response as is illustrated in FIG. 5. Furthermore, resistors 64 and 68 may be omitted. Indeed, resistors 42, 56, 64 and 68 are selected to control the damping of high Q inductors and capacitors, and can all be omitted if low Q parts are used.

Figure 7:
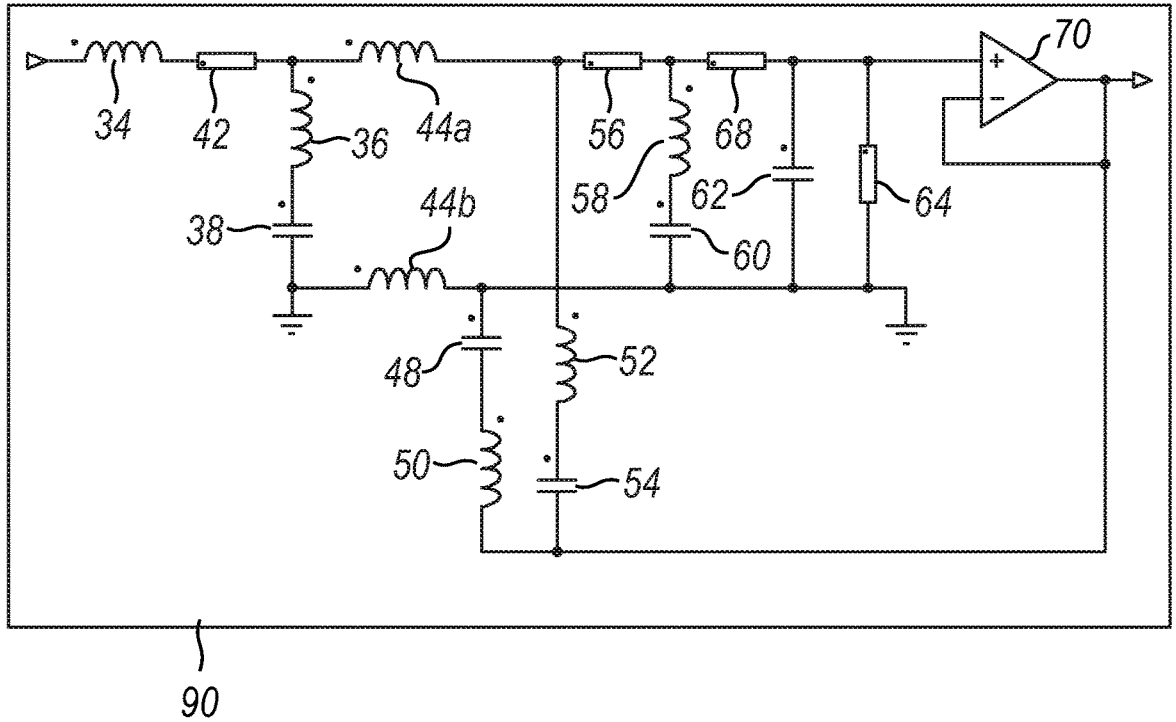
FIG. 7 illustrates a further active filter arrangement.

FIG. 7 illustrates a further active filter arrangement 90. The active filter arrangement 90 includes all the same components illustrated in FIG. 6, except the inductor 50 and the capacitor 54 are coupled to the output of the voltage follower 70.

The filter arrangements depicted in FIG. 6 and FIG. 7 have very close in-band responses, and the filter arrangement depicted in FIG. 6 has an in-band phase improvement of 2 degrees. However, the filter arrangement depicted in FIG. 6 has an out-of-band response that is dependent on operational amplifier characteristics whereas the filter arrangement depicted in FIG. 7 response is controlled entirely by the passive components. The filter arrangements depicted in FIG. 6 and FIG. 7 may be followed by an operational amplifier gain stage to adjust the Q/width of the filter.

Each of the inductors mentioned herein may be implemented as a wound inductor or magnetic device, in PCB trace/track, as an electronic circuit that produces inductance by means of phase shift control.

The examples described with respect to FIGS. 2 and 4 are pulse width modulation or PWM circuit arrangements. However, it will be appreciated that the filter arrangements described in association with FIGS. 2, 4, 6 and 7 could be used in a pulse density modulation circuit or a circuit arrangement whereby a digital bit stream (e.g. direct stream digital, super audio compact disc, and line level signals) is used to switch an FET transistor, or a communication receiver circuit involving the use of a signal (analogue or digital) modulated by a carrier wave, for example. In other words, the filter arrangements described herein may be used with any circuit arrangement which use a switching arrangement similar to the one illustrated in FIG. 2 or a system utilizing a modulated carrier wave signal.

Figure 8:
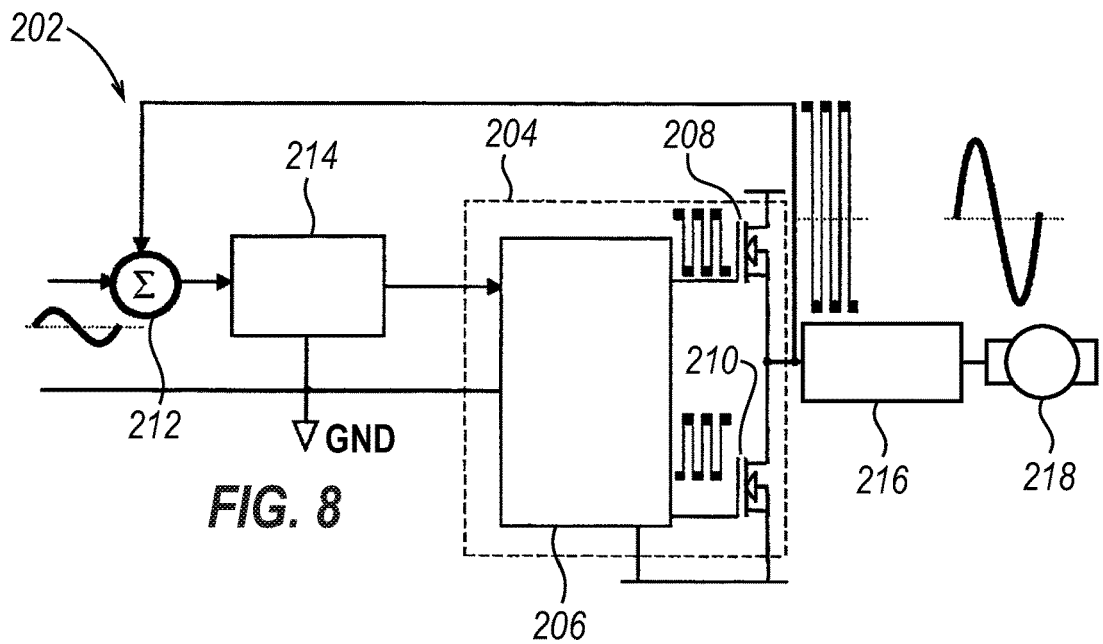
FIG. 8 is a motor controller which can be used with the filter arrangements described in association with FIGS. 2 and 4.

For example, the filter arrangements described in association with FIGS. 2, and 4 could be used in the circuit arrangement 202 illustrated in FIG. 8. The circuit arrangement 202 is a motor controller and includes a power stage 204, which is fed by Block 214. Block 214 includes an integrator, comparator and switching frequency clock generator, with the clock typically in the form of a triangular or saw-tooth waveform. The power stage 204 includes a gate driver or switching controller 206 which generates a signal comprising square pulses of fixed amplitude with a varying width and separation. It will be appreciated that the gate driver generates a signal and an inverted and time delayed version of the same. The power stage 204 includes two switching devices 208, 210. The output of the gate driver 206 is coupled to the two switching devices in a push-pull or totem-pole arrangement. In the circuit illustrated in FIG. 8, the switches are field effect transistors (FET) 208, 210. In the figure, the upper FET 208 is driven by the signal output by the driver 206 and the lower FET 210 is driven by the inverted and time delayed version of the same. The two switches 208, 210 are arranged so as to be either fully on or fully off such that the output of the switching devices is at either +Vcc or −Vcc (i.e. the bus voltages). This type of arrangement utilises the property that if the push-pull output devices are either fully on or fully off they dissipate their minimum power leading to high amplifier efficiency. The output of the power stage 204 is fed back to summation 212, whereby the input audio signal is summed with the output of the power stage 204. The summed signal is fed to block 214 to assist in compensating for variations in the output voltage with respect to the input voltage, due to finite and varying load configurations, and variations in bus voltage.

The output of the power stage 204 is filtered using a filter arrangement 216 to filter out the switching frequency to allow a motor 218 of the circuit 202 to only see a motor control signal. The filter arrangement 216 may be one of the filter arrangements described in association with FIGS. 2 and 4 for high power conditions.

Figure 9:
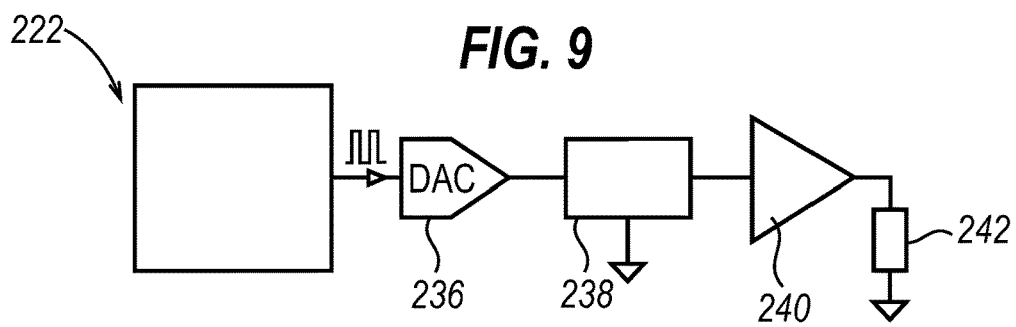
FIG. 9 is a system block diagram which can be used with the filter arrangements described in association with FIGS. 6 and 7.

In a further example, the filter arrangements described in association with FIGS. 6 and 7 could be used in the circuit arrangement illustrated in FIG. 9. The circuit arrangement assists in the conversion of a low power PWM source, for example, into a low power analogue waveform, in order to be processed, amplified or transduced by an analogue mechanism. In the circuit arrangement of FIG. 9 there is provided a low power PWM source 222 (or a bit-stream or DSD source) coupled to a Digital-to-Analogue Converter (DAC) 236 that uses a fixed switching frequency (e.g. a Direct Stream Digital or DSD DAC) which is coupled to a filter arrangement 238 to filter out the switching frequency of the low power PWM source 222. The filter arrangement 238 may be one of the filter arrangements described in association with FIGS. 6 and 7. The output of the filter arrangement 238 is coupled to an analogue amplifier or a digital amplifier 240, which drives the load 242. The load 242 in this example is a loudspeaker. The active configuration illustrated in FIG. 9 may be used in low power conditions such as line level.

Figure 10:
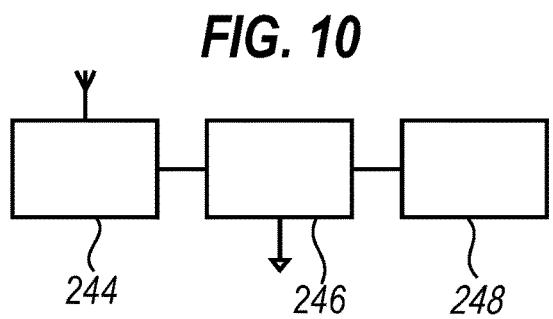
FIG. 10 is a system block diagram illustrating an electromagnetic transmission carrier signal (e.g. RF) recovery application.

FIG. 10 is a system block diagram illustrating an electromagnetic transmission carrier signal (e.g. RF) recovery application. In the system illustrated in FIG. 10, there is provided a modulated carrier receiver 244 as is known in the art (e.g. an antenna coupled to a pre-amplifier and amplifier). The receiver 244 is coupled to a filter arrangement 246, which is tuned to remove the carrier component/signal (or the modulated frequency component) from the received signal. The filter arrangement 246 may be one of the filter arrangements described in association with FIGS. 2, 4, 6 and 7. The output of the filter arrangement 246 is coupled to a post processing block 248 dependent on the application. For example, the received signal might be a modulated audio signal and the post processing block is an audio amplifier driving a loudspeaker. The system illustrated in FIG. 10 might be a digital or analogue topology.

Figure 11:
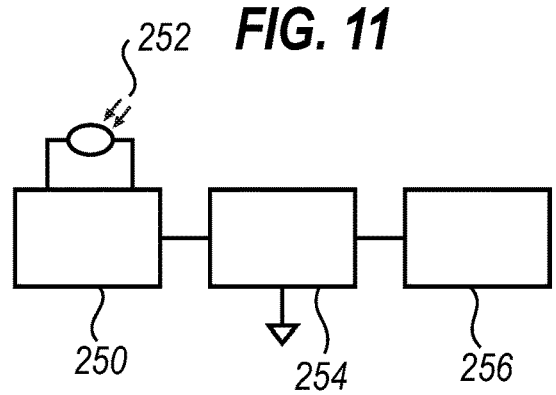
FIG. 11 is a system block diagram illustrating an electromagnetic transmission carrier signal (e.g. optical) recovery application.

FIG. 11 is a system block diagram illustrating an electromagnetic transmission carrier signal (e.g. optical) recovery application. In the system illustrated in FIG. 11, there is provided an optical detection device 252 coupled to a modulated carrier receiver 250 (e.g. transimpedance and voltage gain amplifiers) as is known in the art. The receiver 250 is coupled to a filter arrangement 254, which is tuned to remove the carrier wave/component (or the modulated frequency component) of the received signal. The filter arrangement 254 may be one of the filter arrangements described in association with FIGS. 2, 4, 6 and 7. The output of the filter arrangement 254 is coupled to a post processing block 256 dependent on the application. The system illustrated in FIG. 11 might be a digital or analogue topology.

Any quoted attenuation figures are from simulation and have utilised accurate RF models incorporating parasitic components where applicable, therefore, carefully selected components may be close to, but may not necessarily match, the simulated performance.

It will be appreciated that the foregoing discussion relates to particular embodiments. However, in other embodiments, various aspects and examples may be combined.

The following examples form part of the present disclosure:

1. An electronic apparatus comprising:
   a circuit element configured to output a signal comprising a modulated frequency component; and
   a first, series shunt configuration arranged at a signal output of the circuit element comprising a first inductor and a first capacitor coupled in series, wherein the first inductor and the first capacitor are configured to generate a notch in a frequency response of the first, series shunt configuration to attenuate the output signal at a frequency of the modulated frequency component.

2. The apparatus of example 1, comprising a low-pass filter arranged at a signal output of the circuit element, wherein the low-pass filter comprises a second, series inductor and the first capacitor of the first, series shunt configuration.

3. The apparatus of example 1 or example 2, wherein the output signal is a pulse width modulated signal.

4. The apparatus of any one of examples 1 to 3, wherein the output signal is an audio signal or a motor control signal.

5. The apparatus of any one of examples 1 to 4, wherein the modulated frequency component is a triangular waveform.

6. The apparatus of any one of examples 1 to 5, wherein the circuit element is a switching amplifier.

7. The apparatus of example 6, wherein the switching amplifier is a pulse width modulation amplifier.

8. The apparatus of example 1 or example 2, wherein the circuit element is a modulated carrier signal receiver, and the modulated frequency component is a carrier signal.

9. The apparatus of any preceding example, comprising one or more filters arranged at the signal output of the circuit element, each filter comprising a third series inductor, and a second, series shunt configuration comprising a fourth inductor and a second capacitor coupled in series, wherein the fourth inductor and the second capacitor are configured to have a frequency response based on a frequency of the modulated frequency component.

The invention claimed is:

1. An electronic apparatus comprising:
   a circuit element configured to output a signal comprising a modulated frequency component;
   a filter arrangement comprising first, second and third notch filter arrangements, wherein each of the first and second notch filter arrangements comprise a first series inductor, and a series shunt configuration comprising a second inductor and a capacitor coupled in series and the third notch filter arrangement comprises a series inductor and a shunt capacitor, wherein each of the notch filter arrangements are configured to generate a notch in a frequency response to attenuate the output signal at a frequency of the modulated frequency component; and
   a fourth notch filter arrangement comprising an inductor and a capacitor coupled in series, wherein the inductor and the capacitor of the fourth notch filter arrangement is coupled to the first series inductor of the second notch filter arrangement.

2. The apparatus of claim 1, wherein the first series inductor of each of the second and third notch filter arrangements is a common mode choke.

3. The apparatus of claim 1, wherein the first series inductor of the second notch filter arrangement is coupled to the first series inductor of the first notch filter arrangement, and wherein the series inductor of the third notch filter arrangement is coupled to the capacitor of the first notch filter arrangement.

4. The apparatus of claim 2, wherein the first series inductor of the second notch filter arrangement is coupled to the first series inductor of the first notch filter arrangement, and wherein the series inductor of the third notch filter arrangement is coupled to the capacitor of the first notch filter arrangement.

5. The apparatus of claim 1, further comprising a voltage follower arranged at an output of the filter arrangement.

6. The apparatus of claim 1, wherein the output signal is a pulse width modulated signal.

7. The apparatus of claim 1, wherein the output signal is an audio signal or a motor control signal.

8. The apparatus of claim 1, wherein the modulated frequency component is a triangular waveform.

9. The apparatus of claim 1, wherein the circuit element is a switching amplifier.

10. The apparatus of claim 9, wherein the switching amplifier is a pulse width modulation amplifier.

11. The apparatus of claim 1, wherein the circuit element is a modulated carrier signal receiver, and the modulated frequency component is a carrier signal.

12. The apparatus of claim 2, wherein the circuit element is one of a switching amplifier or a modulated carrier signal receiver wherein the modulated frequency component is a carrier signal.

13. The apparatus of claim 3, wherein the circuit element is one of a switching amplifier or a modulated carrier signal receiver wherein the modulated frequency component is a carrier signal.

14. The apparatus of claim 5, wherein the circuit element is one of a switching amplifier or a modulated carrier signal receiver wherein the modulated frequency component is a carrier signal.

15. The apparatus of claim 2, further comprising a voltage follower arranged at an output of the filter arrangement.

16. The apparatus of claim 2, wherein the output signal is one of a pulse width modulated signal, an audio signal, or a motor control signal.

* * * * *